United States Patent [19]
Grabmaier et al.

[11] Patent Number: 4,533,428
[45] Date of Patent: Aug. 6, 1985

[54] METHOD AND DEVICE FOR ASYMMETRICALLY COATING A TAPE-SHAPED CARRIER BODY WITH SILICON FOR FURTHER PROCESSING INTO SOLAR CELLS

[75] Inventors: Josef Grabmaier, Berg; Richard Falckenberg, Unterhaching; Helmut Föell, Munich, all of Fed. Rep. of Germany

[73] Assignee: Siemens Aktiengesellschaft, Berlin & Munich, Fed. Rep. of Germany

[21] Appl. No.: 512,732

[22] Filed: Jul. 11, 1983

[30] Foreign Application Priority Data

Aug. 23, 1982 [DE] Fed. Rep. of Germany ....... 3231267

[51] Int. Cl.³ .............................. H01L 21/208
[52] U.S. Cl. .................... 156/608; 156/DIG. 88; 422/246; 427/74
[58] Field of Search ................. 156/608, 617 SP, 622, 156/624, DIG. 64, DIG. 88, DIG. 98; 422/246, 249; 118/401, 404; 427/74

[56] References Cited

U.S. PATENT DOCUMENTS

| | | | |
|---|---|---|---|
| 4,171,991 | 10/1979 | Lindmayer | 148/1.5 |
| 4,251,570 | 2/1981 | Zook | 427/74 |
| 4,252,861 | 2/1981 | Heaps et al. | 428/446 |
| 4,430,305 | 2/1984 | Kalejs et al. | 422/246 |

FOREIGN PATENT DOCUMENTS 3036104 4/1981 Fed. Rep. of Germany .
3010557 9/1981 Fed. Rep. of Germany .

OTHER PUBLICATIONS

Belouet "The Growth of Polysilicon Sheets on Carbon Substrates by the RAD Process" Electrochem. Meeting, May 1980, St. Louis USA, Abstract No. 327, pp. 817-818.

Primary Examiner—Evan K. Lawrence
Attorney, Agent, or Firm—Hill, Van Santen, Steadman & Simpson

[57] ABSTRACT

A method for continuously manufacturing silicon tapes which are predominantly coated on one side of the carrier, for solar cells. In an exemplary embodiment, a carrier body consisting of a graphite network is conducted vertically upwards through a guide channel situated in the floor of a silicon melt bath and travels through a crystallization region where the molten silicon crystallizes on the carrier body. The surfaces of the guide channel at each side of the carrier path in the vicinity of the crystallization region are wetted by the molten silicon and have different dimensions in a direction at right angles to the carrier path. As a result of the differential in surface tension forces at the two sides of the path, a meniscus is formed which is asymmetrical relative to the channel opening thereby causing asymmetrical coating of the carrier body.

1 Claim, 4 Drawing Figures

METHOD AND DEVICE FOR ASYMMETRICALLY COATING A TAPE-SHAPED CARRIER BODY WITH SILICON FOR FURTHER PROCESSING INTO SOLAR CELLS

BACKGROUND OF THE INVENTION

The present patent application relates to a method for asymmetrically coating a tape-shaped carrier body with molten silicon for further processing into solar cells upon employment of a device wherein a melt vat accepting the silicon melt is provided, exhibiting a channel in its bottom part for guiding the tape-shaped carrier body, said channel having a slit-like opening and extending in the direction toward the melt surface, the tape-shaped carrier body wound on a supply reel below the melt vat being guided in the opening by said channel, then being moistened by the melt and the coated carrier body than being rewound onto a storage drum disposed above the melt vat in the area of the guide channel, and the invention also relates to apparatus for the practice of said method.

Coatings of carrier bodies with molten silicon are known, for example, from U.S. Pat. No. 4,171,991 and from the Abstract No. 327 by C. Belouet from the Electrochemical Meeting, St. Louis, USA, May 11 through 16, 1980. Whereas, given the former method, a thick fabric comprised of graphite strands is drawn through a melt or is dipped into said melt and is completely moistened by it, given the latter reference a substrate consisting of a graphite plate is conducted through an opening situated in the floor of the melt crucible. The danger thereby exists that molten silicon will run out through the opening in the crucible floor and the coating will thereby be interrupted.

A method which can be executed given a device of the type initially cited can be derived from the German OS 30 10 557 Al. The possibility is provided by means of this device of manufacturing a planar silicon body with a high throughput (1 m$^2$/min). A mesh carrier body consisting of graphite which is resistant to molten silicon and can be well-moistened by silicon is thereby surface-coated with molten silicon and is co-incorporated into the silicon body when the silicon crystallizes. If no special measures are undertaken, the carrier body is generally situated in the center of the planar silicon, i.e., the carrier body is symmetrically coated with silicon. For the following reasons, however, it has proven advantageous to coat the carrier body asymmetrically, i.e., to carry out the coating such that the carrier body is only coated at one side:

1. The employment of the silicon material is reduced to a minimum. Even given a thickness of the silicon layer of only 150 or, respectively, 200 μm, the carrier body, given a mesh thread thickness of 50 or, respectively, 100 μm, is outside of the effective part of the solar cell, i.e., outside of the cell area in which charge carriers are generated by means of light absorption (penetration depth ≲100 μm). Since the carrier body lies outside of the penetration depth of the light, no reduction of the efficiency due to "shadowing" occurs.
2. The carrier body can be directly incorporated in the back electrode.
3. The crystallization growth obstacles proceeding from the carrier body and negatively influencing the surface growth can be largely suppressed. Quasi-mono-crystalline surface growth can thereby be achieved, this having a favorable effect on the efficiency of the solar cell.

A method for drawing a polycrystalline silicon layer onto a carbonized ceramic substrate is known from the German OS 30 36 104 Al wherein an asymmetrical coating of the substrate is achieved in that the substrate is withdrawn from the silicon melt in an attitude deviating from the vertical, whereby the heating ensues due to the lower, non-coated layer which is still immersed. As a result of conducting the carrier body obliquely up (angle relative to the vertical approximately 10°), an asymmetrical coating of the carrier body is achieved which, given a vertical guidance of the carrier body toward the top, as is the case given the method of the type initially cited, leads to a symmetrical coating. Oblique drawing of planar silicon, however, particularly when drawing with an after-heating zone which is indispensible given fast drawing and for a high crystal quality of the silicon, is very involved technically and problematical.

SUMMARY OF THE INVENTION

It is therefore an object of the invention to specify a method with which as high as possible a throughput given low material consumption can be achieved unproblematically with simple means.

Given employment of a device similar to that according to the German OS 30 10 557, this object is inventively achieved in that the carrier body placed in contact with the melt is exposed in the crystallization region of the molten silicon to materials differently moistenable by silicon or is limited by asymmetrically-shaped parts. It thereby lies within the framework of the inventive idea that the carrier body coated with silicon consists of a network of graphite threads or of graphitized silica glass threads. Graphite with a wetting angle $\alpha << 90°$ ($=30°$) and quartz having a wetting angle $\alpha \gtrless 90°$ are employed, for example, as differently wetting materials.

Further details, particularly concerning the structure of the devices for the execution of the method according to the teaching of the invention can be derived from the schematically drawn FIGS. 1 through 4 of the accompanying drawing sheet and from their description; and other objects, features and advantages will be apparent from this detailed disclosure and from the claim.

DETAILED DESCRIPTION

Figure 1:
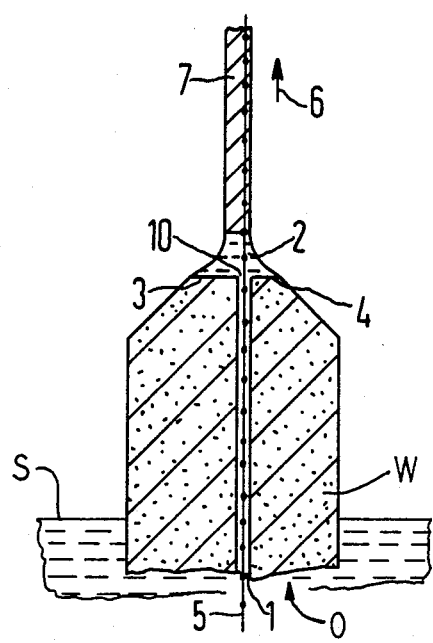
FIGS. 1, 2 and 4 illustrate embodiments of the guide channel in the area of the gap-like opening (crystallization region)

Identical reference numerals apply to corresponding parts in all Figures.

FIG. 1: The arrangement illustrated here shows a channel 1 whose walls consist of a material which can be well-moistened by molten silicon 2 (wetting angle $\alpha << 90°$). Its minor cross-sectional dimension should be such that the molten silicon 2 can rise in it toward the opening 10 as the result of capillary forces. Suitable, for example, for this purpose is graphite having a wetting angle $\alpha = 30°$. The two lips 3 and 4 of the gap-like opening 10 of the channel 1, as can be derived from FIG. 1, are of different widths (lip 3 broader than lip 4). Thereby achieved is a meniscus formation in the crystallization region which is asymmetrical relative to the opening 10 such that a tape-shaped graphite network 5 serving as carrier body which is drawn through the slit-like opening 10 in the direction of arrow 6 is asymmetrically coated with silicon. The coated graphite mesh is referenced with the reference numeral 7.

Figure 2:
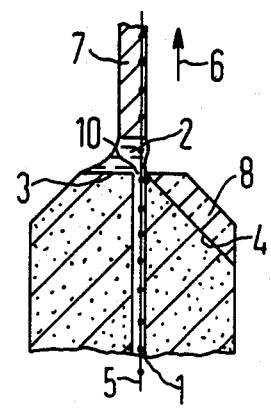

FIG. 2: An asymmetrical coating of the carrier body 5 with silicon is also achieved when, in addition to the measure of employing lips 3 and 4 of the guide channel 1 having different widths, the lips 3 and 4 in the area of the slit-like opening 10 (crystallization region) consist of materials having different wetting behavior relative to molten silicon. Given the exemplary embodiment illustrated here, the lip 3 consists of graphite ($\alpha < <90°$) and the lip 4, in its upper end area 8, consists of quartz ($\alpha \geq 90°$). The same condition applies to the channel minor cross-sectional dimension as in the exemplary embodiment according to FIG. 1. We should like to draw attention to the special formation of the melt surface in the crystallization region above the slit-like opening (10).

Figure 3:
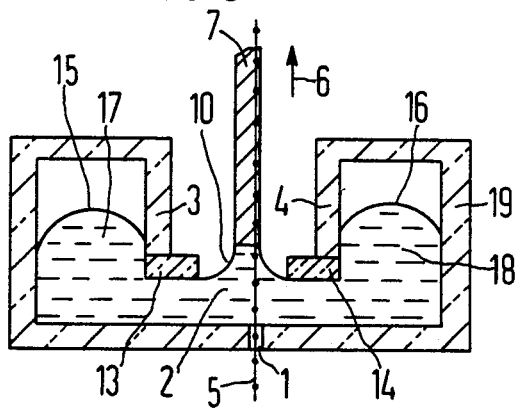
FIG. 3 shows the parts of a device which are essential for implementing a further embodiment of the invention.

FIG. 3: In a further embodiment, the two lips at the upper opening 10 of the channel 1 consist of a material poorly moistenable ($\alpha \gtreqqless 90°$) by the silicon melt 2, for which purpose, for example, quartz or sapphire are employed for the parts 13 and 14 defining the crystallization region. Moreover, the spacing of the two quartz pieces 13 and 14 at the upper end of the channel 1 amounts to at least one millimeter (1 mm). The molten silicon 2 is pressed up in the channel toward the opening 10, whereby the pressure required for this purpose is produced by the elevated melt levels 15 and 16 in the two symmetrical side chambers 17 and 18 of the melting vat 19 consisting of quartz. The carrier body consisting of the graphite network 5 is eccentrically guided in the channel, this occurring by means of lateral offset of the gap-like opening (1) in the floor of vat 19 relative to the center of the melt vat, i.e., the center of the gap between quartz parts 13 and 14.

Figure 4:
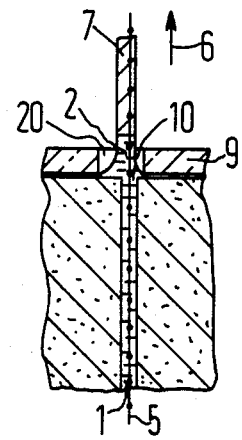

FIG. 4: A further alternative for asymmetrical coating of a tape-shaped carrier body in the form of a graphite mesh 5 is given in that the walls of the guide channel 1 for the carrier body 5 and silicon melt 2 consist of material well-moistenable by molten silicon, for example, consisting of graphite, and the slit-like opening 10 of the channel 1 is covered with a plate 9 consisting of quartz provided with a hole 20 such that the slit-like opening 10 of the guide channel 1 eccentrically discharges into the hole 20 situated in the center of the plate (9), the offset being analogous to that shown in FIG. 3, but the channel 1 having a minor cross-sectional dimension corresponding to the thickness dimension of carrier body 5 such that molten silicon will rise in it to the crystallization region at hole 20.

It will be apparent that many modifications and variations may be made without departing from the scope of the teachings and concepts of the present invention.

SUPPLEMENTARY DISCUSSION

Referring to the embodiment of FIG. 1, a showing of a melt vat and also of openings O in the wall W of the channel 1 below the surface S of the melt in the vat is found for example in the first figure of a related German application No. P 32 31 268.7 filed Aug. 23, 1982, applicants' reference no. VPA 82 P 1695 DE. A similar arrangement of melt vat and wall openings is applicable to the embodiments of FIGS. 2 and 4 herein. The disclosure of said related German application is incorporated herein by reference. The related German application No. P 32 31 326.8 also filed Aug. 23, 1982, applicants' reference no. VPA 82 P 1696 DE is referred to concerning the use of a vertical capillary channel for delivering molten silicon to a crystallization region above the level of the silicon in the vat.

The disclosure of said German application No. P 32 31 326.8 teaches that the capillary passage means need not entirely coincide with the vertical path of the carrier body as is specifically illustrated in FIGS. 1, 2 and 4 of the present drawings (but may also be disposed in vertical alignment with the upper edge surface forming lip portion 3, for example so as to deliver the molten silicon predominantly to this side of the carrier body).

The contouring of the upper boundaries defining the lip portions 3 and 4 in FIG. 1, and the provision of the different material at 8 in FIG. 2 serve to constrain the melt to occupy a crystallization region relative to the path of the carrier body such that the coating forms predominantly at one side of the central plane of the carrier body. It will be noted that a channel such as shown in FIGS. 1, 2 or 4 may extend obliquely rather than vertically without detriment since the crystallization region is separate from the melt body itself (as confined by the vat to freely assume a horizontal configuration as at S, FIG. 1).

According to FIGS. 1–4, the material of the surfaces defining the crystallization region (which are stationary rather than part of the moving carrier body) serve to constrain the melt to the desired asymmetrical configuration at the crystallization region without requiring an oblique path of the carrier body where it leaves the melt surface S. The constraint is effected by means of the differential in surface tension forces at the two sides of the path of the carrier body provided by the stationary (e.g. equally heated) surfaces of materials 3, 4, 8, 13, 14 and 9. The presence of a capillary channel means at (or favoring) one side of the path of the carrier body can also be regarded as being the result of materials (separate from the carrier) providing a differential in surface tension forces at the respective sides of the carrier path which constrain the melt to a non-symmetrical configuration at the crystallization region.

We claim as our invention:

1. A method for asymmetrically coating a tape-shaped carrier body with crystallized silicon, for further processing into solar cells, said method comprising
   moving a tape-shaped carrier body along a generally vertical carrier path leading out of a melt vat containing a silicon melt, with the carrier body moving generally vertically as it moves above a melt surface in the vat,
   causing molten silicon from the melt to be applied to the carrier body at a crystallization region of the generally vertical carrier path so that the molten silicon crystallizes on the carrier body, and
   physically constraining the molten silicon by means of solid material at each side of the generally vertical carrier path in the vicinity of the crystallization region to cause the molten silicon to be asymmetrically distributed on the respective sides of the carrier path in the vicinity of the crystallization region such that the silicon is coated predominantly on one side of the carrier body, wherein the molten silicon is caused to rise from the silicon melt to a crystallization region above the melt surface along the generally vertical carrier path as a result of capillary forces, with the physically constraining step being effected by surfaces of solid material which are located at the crystallization region so as to receive molten silicon as a result of the capillary forces, and which are wetted by the molten silicon, the surfaces of the solid material at the respective sides of the carrier path having different dimensions in the direction at right angles to the carrier path to provide corresponding different extents of the molten silicon at the respective sides of the carrier body in the vicinity of the crystallization region.

* * * * *